United States Patent [19]

DiTroia

[11] Patent Number: 4,547,960

[45] Date of Patent: Oct. 22, 1985

[54] METHODS OF AND FIXTURE FOR ESTABLISHING AN ELECTRICAL CONNECTION

[75] Inventor: Anthony J. DiTroia, Andover, Mass.

[73] Assignee: AT&T Technologies, Inc., New York, N.Y.

[21] Appl. No.: 707,307

[22] Filed: Apr. 1, 1985

Related U.S. Application Data

[63] Continuation of Ser. No. 373,196, Apr. 29, 1982, abandoned.

[51] Int. Cl.$^4$ ...................... H01R 13/54; G01R 31/02

[52] U.S. Cl. .................................. 29/593; 324/158 F; 339/17 C; 339/75 MP

[58] Field of Search ............... 29/593, 854; 339/75 R, 339/75 M, 75 MP, 17 C; 324/73 PC, 158 F, 158 P

[56] References Cited

U.S. PATENT DOCUMENTS

| | | | |
|---|---|---|---|
| 2,982,883 | 5/1961 | Gordy | 317/101 |
| 3,587,037 | 6/1971 | Anhalt | 339/75 |
| 3,805,159 | 4/1974 | Richelmann | 324/158 F |
| 3,942,858 | 3/1976 | Ouchi | 339/75 R |
| 4,062,617 | 12/1977 | Johnson | 339/75 M |
| 4,068,170 | 1/1978 | Chayka et al. | 324/72.5 |
| 4,152,644 | 5/1979 | Lockhart, Jr. | 324/158 F |
| 4,217,020 | 8/1980 | Holland | 339/75 M |
| 4,230,986 | 10/1980 | Deaver et al. | 324/158 F |

FOREIGN PATENT DOCUMENTS 133734 1/1979 German Democratic Rep. ... 339/75 M

OTHER PUBLICATIONS

IBM Technical Disclosure Bulletin, vol. 10, No. 5, pp. 549-550.

IBM Technical Disclosure Bulletin, vol. 13, No. 5, p. 1265.

Western Electric Technical Digest, No. 34, Apr. 1974, pp. 13-14.

*Primary Examiner*—Z. R. Bilinsky

*Attorney, Agent, or Firm*—J. B. Hoofnagle; H. St. Julian; M. de Picciotto

[57] ABSTRACT

Leads (22) of an electrical component (20) are positioned within and extend through a plurality of apertures (74) formed through a substrate (54). The substrate (54) includes a circuit (56) formed on one major surface thereof and a plurality of contacts (76) mounted thereon which is electrically connected to the circuit (56) and which overlaps a portion of the appropriate one of the plurality of apertures (74) formed therethrough. A lead pusher (32) moves the leads (22) into engagement with the contacts (76). Thereafter, free ends of the leads (22) are moved beyond a point of engagement between the leads and the contacts (76) so that the lead is flexed to insure a firm engagement between the leads and the contacts.

3 Claims, 5 Drawing Figures

Fig. 4
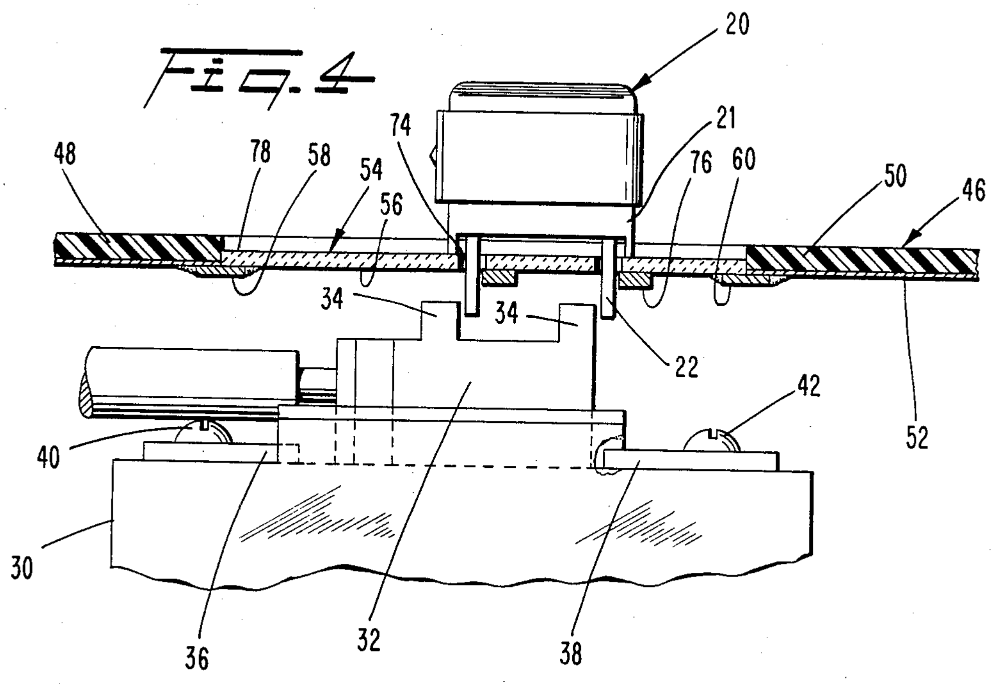
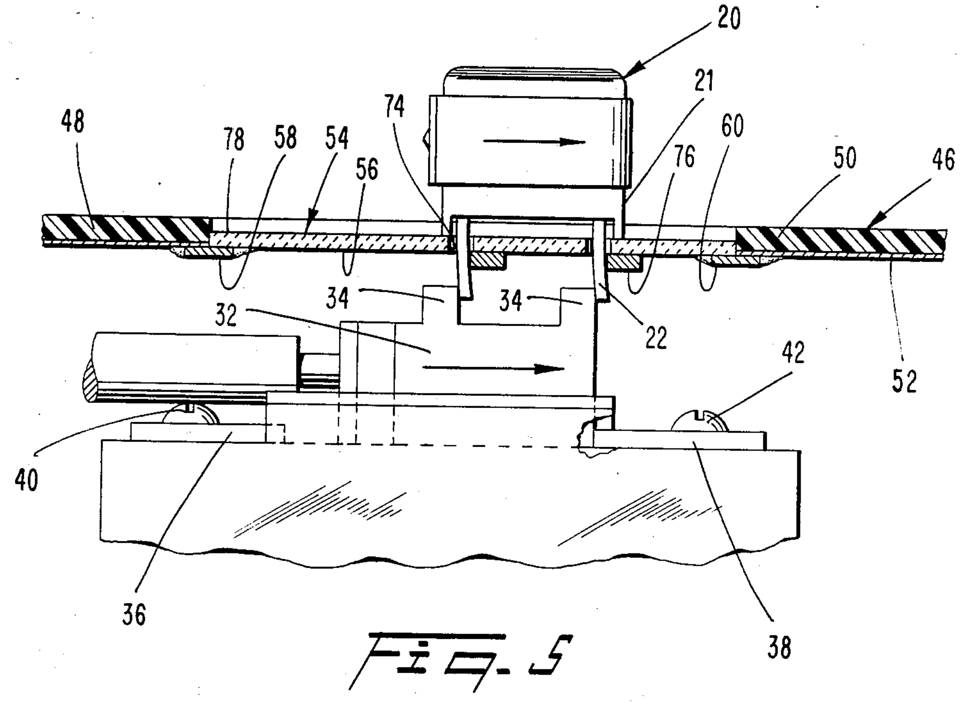
Fig. 5

METHODS OF AND FIXTURE FOR ESTABLISHING AN ELECTRICAL CONNECTION

This is a continuation of application Ser. No. 373,196 filed Apr. 29, 1982, now abandoned.

TECHNICAL FIELD

This invention relates to methods of and a fixture for establishing an electrical connection, and more particularly to methods of and a fixture for connecting a lead of an electrical component to a circuit.

BACKGROUND OF THE INVENTION

In testing electrical components having a plurality of leads, the leads are frequently inserted into socket-type contacts which are coupled to an associated test circuit. Socket-type contacts typically include spaced contact fingers which provide a resilient opening into which the leads are inserted. Ideally, the resiliency of the fingers insures proper electrical contact between the leads and the test circuit. However, due to constant use, the resiliency of the contact fingers is reduced. Moreover, the leads are coated typically with solder which results in a larger and nonuniform size of the leads. Thereafter, when the solder coated leads are inserted into the socket-type contacts, the contacts tend to (1) wear rapidly, (2) lose their resiliency and (3) permanently separate to a position where proper electrical contact is no longer insured. Additionally, as the leads of successive components are inserted into the socket-type contacts, the contacts tend to make electrical engagement with the leads at different points on the leads thus introducing a variable into the testing process. This is particularly undesirable where sensitive electrical parameters, such as the insertion loss of 100 MHz pulse transformers, are being measured. In addition, as the socket-type contacts wear and have to be replaced, the testing system must be recalibrated. Similarly, the conductors connecting the socket-type contacts to the test circuit also tend to introduce undesirable variables into the testing system.

In an attempt to overcome the above-mentioned disadvantages, the use of zero-insertion force test contacts have been used. One known fixture, which facilitates the testing of amplifiers and which utilizes zero-insertion force test contacts, includes a plurality of lead-receiving slots. A test contact is positioned adjacent one end of each of the plurality of slots. A spring biased plunger is positioned adjacent an opposite end of each of the plurality of slots. To insert the leads of the amplifier the plungers are moved in a direction away from the test contacts. The leads are then inserted into the slots and the plungers are released so that the biasing action of each of the plungers forces the associated leads into one of the test contacts. Capacitors, which are coupled to an opposite end of the test contacts, are connected to a test set through electrical jacks. While this fixture helps reduce damage to the leads and to reduce wear on the test contacts, the fixture is still susceptible to the introduction of undesirable variables into the testing system.

Accordingly, a purpose of this invention is to provide a method and fixture for establishing an electrical connection to a circuit which avoids the introduction of undersirable variables into the testing system.

SUMMARY OF THE INVENTION

This invention relates to methods of and a fixture for an establishing electrical connection between a circuit and a lead of an electrical component. The circuit is formed on one major surface of a substrate having a contact mounted thereon which is electrically connected to the circuit and overlaps a portion of an aperture formed therethrough. The lead having a diameter, which is smaller than the diameter of the aperture, is positioned within the aperture. The lead is moved laterally of and within the aperture toward the contact. Thereafter, the lead is urged into engagement with a portion of the contact which overlaps the aperture.

BRIEF DESCRIPTION OF THE DRAWINGS

FIGS. 4 and 5 are sectional views of the fixture of FIG. 2 having the component of FIG. 1 supported thereon and embodying certain principles of the invention.

DETAILED DESCRIPTION

Figure 1:
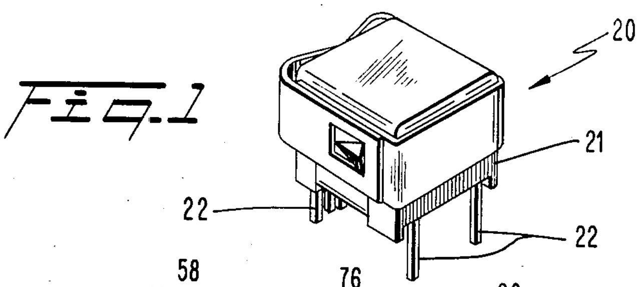
FIG. 1 is a perspective view showing an electrical component having a plurality of leads extending therefrom.

Referring to FIG. 1, an electrical component, such as a pulse transformer, designated generally by the numeral 20, includes a body 21 having a plurality of leads 22 extending therefrom. Prior to using the electrical component 20 in its ultimate environment, it is desirable to measure its transmission characteristics. During the measurement of the transmission characteristics, the presence of stray inductance and capacitance affect the accuracy of the measured characteristics. Thus, to minimize the effects of stray inductance and capacitance, electrical leads (not shown) utilized to couple the component 20 to a testing system (not shown) must be reduced to a minimum length.

Figure 2:
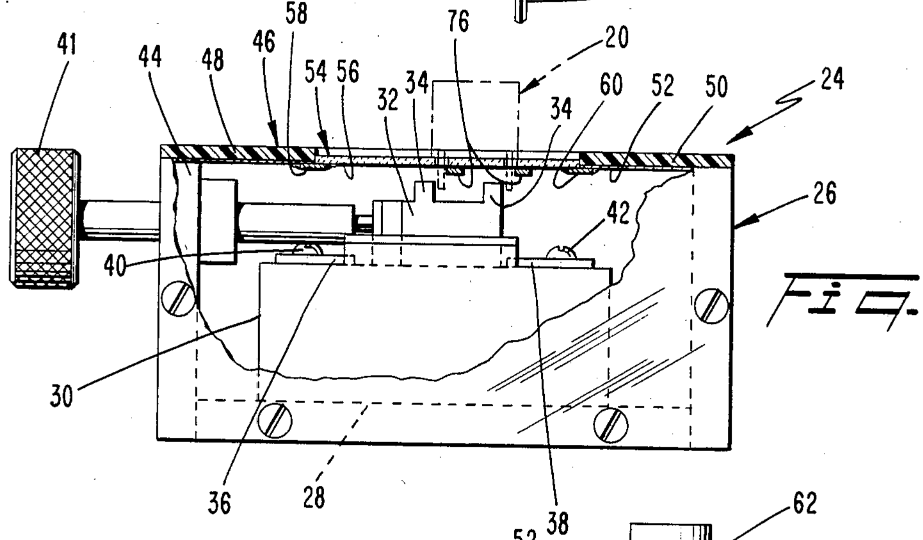
FIG. 2 is a view showing the fixture embodying certain principles of the invention.
Figure 3:
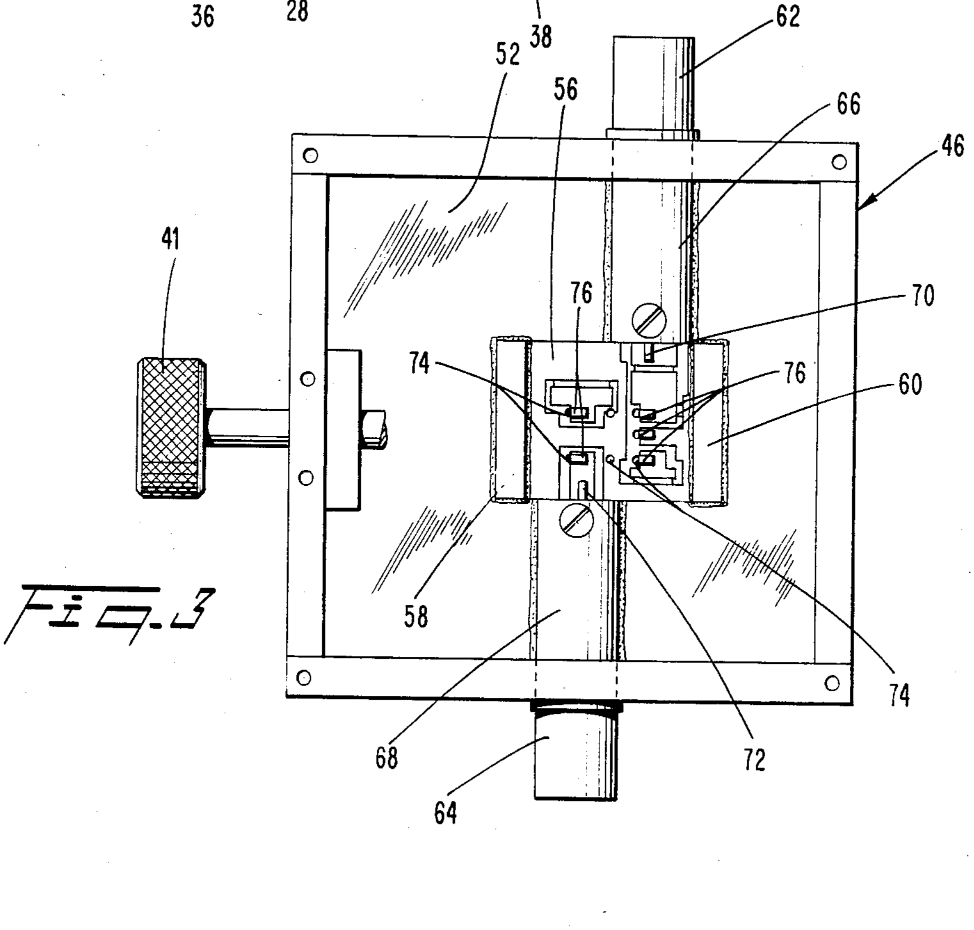
FIG. 3 is a bottom view of a top section of the fixture of FIG. 2 and embodying certain principles of the invention.

Referring to FIG. 2, a test fixture, designated generally by the numeral 24, facilitates the testing of the electrical component 20. The fixture 24 includes an enclosure, designated generally by the numeral 26, having a bottom surface 28 with a pedestal 30 supported thereon. A lead pusher, such as slide 32, having spaced shoulders 34 extending upwardly therefrom, is mounted for reciprocal sliding movement on the pedestal 30 between stops 36 and 38. The stops 36 and 38 are attached fixedly to the pedestal 30 by screws 40 and 42, respectively. A thumb screw 41, which is threadedly mounted in a side wall 44 of the enclosure 26, is coupled to the slide 32 and facilitates the reciprocal sliding movement thereof. Enclosure 26 also includes a top, designated generally by the numeral 46. The top 46 includes two electrically nonconductive boards 48 and 50 each having a layer 52 of solder plated to one major surface thereof. A substrate 54, having a thin film test circuit 56 formed thereon, is positioned between boards 48 and 50, as illustrated in FIG. 3. The substrate 54 is also attached to the layer 52 of solder by strips 58 and 60.

Referring to FIG. 3, two coaxial connectors 62 and 64 are also positioned between boards 48 and 50. The connectors 62 and 64 facilitate coupling of the test circuit 56 to a test set (not shown). Each of the connectors 62 and 64 include outer sleeves 66 and 68, respectively, which are attached to the layer 52 of solder and inner-core conductors 70 and 72, respectively, which are attached to the test circuit 56. The substrate 54 includes a plurality of lead-receiving apertures 74. A plurality of test contacts 76 are mounted on the test circuit 56. Each test contact 76 is placed in a position overlapping one edge of an associated one of the plurality of lead-receiving apertures 74. By mounting the test contacts 76 directly on the test circuit 56, the effects of stray inductance and capacitance are minimized by reducing the distance between the test circuit and the plurality of leads 22 subsequently positioned within the apertures 74.

In use, the leads 22 of the electrical component 20 are positioned within the lead-receiving apertures 74 and the body 21 of the component rest on an upper surface 78 of the substrate 54 as illustrated in FIG. 4. The diameter of each of the lead receiving apertures 74 is larger than the diameter of each of the leads 22 to facilitate a frictionless insertion of the leads within the apertures. The thumb screw 41 is then rotated to facilitate a left-to-right movement of the slide 32 as viewed in FIG. 4. As a result of the movement of the slide 32, the shoulders 34 engage the leads 22 and facilitate relative movement between the leads 22 and the substrate 54. Moreover, the body 21 of the component 20 slides along upper surface 78 of the substrate 54 as a result of the movement of the leads 22 whereby the component moves from left to right as viewed in FIG. 4. By allowing the body 21 to move along with the leads 22 until the leads engage the test contacts 76, stresses, which would normally be exerted on the leads if the body had been held in a stationary position, are thereby reduced. The movement of the leads 22 continues whereby the leads are urged into engagement with portions of the contacts 76 which overlaps the apertures 74 and until the slide 32 engages stop 38. As illustrated in FIG. 5, the stop 38 is mounted on the pedestal 30 so that the leads 22 are slightly flexed after contacting the appropriate test contact 76 to insure a firm engagement therewith.

As noted above, each of the test contacts 76 overlaps its associated lead-receiving aperture 74. Test contacts 76 in this position provides (1) a full surface for the engagement of the leads 22, and (2) permits some wear of the test contact before replacement of the contact is required. Since the test contacts 76 are mounted on the test circuit 56, the distance between the leads 22 and the circuit 48 are at a minimum and the effects of stray inductance and capacitance are reduced. Thereafter, the transmission parameters associated with the component 20 are measured by the test set (not shown). After various transmission parameters of the component 20 have been measured, the thumb screw 41 is rotated in an opposite direction to facilitate a right-to-left movement of the slide 32 as viewed in FIG. 5. The movement of the slide 32 continues until the slide engages stop 36 thus enabling the leads 22 to return to an unflexed position and to permit the removal of the component 20 from the fixture 24.

What is claimed is:

1. A method of establishing a temporary electrical connection between a circuit and a plurality of leads arranged in at least two rows of an electrical component which includes a body wherein the circuit is formed on a first major surface of a substrate having contacts mounted thereon which are electrically connected to the circuit, each contact having a portion overlapping an associated one of a plurality of non-conductive apertures formed through the substrate, and each lead having a diameter which is smaller than the diameter of its associated aperture, the method comprising the steps of:

inserting the plurality of leads of the electrical component in the plurality of non-conductive apertures formed through the substrate so that the component body rests on a second major surface of the substrate and respective end portions of the leads protrude from said substrate;

moving the plurality of leads laterally of and within the plurality of apertures into engagement with respective contacts while sliding the component body over the second major surface of the substrate;

urging the tip-end portions of the plurality of leads into flexed and uncrimped engagement with the portion of the respective contacts which overlaps the associated one of the non-conductive apertures for testing;

unflexing the plurality of leads; and removing the plurality of uncrimped leads from the apertures.

2. A fixture for making a temporary electrical connection, which comprises:

a substrate having a plurality of lead-receiving non-conductive apertures formed therethrough;

a circuit formed on one major surface of the substrate;

a plurality of contacts mounted on said one major surface, each contact overlapping a portion of an associated one of the plurality of apertures and electrically connected to the circuit; and means for moving respective tip portions of a plurality of an electrical component leads extending through and out of associated apertures into flexed and uncrimped engagement with respective contacts in order to enable testing of the electrical component.

3. The fixture as recited in claim 2 further comprises:

an enclosure having bottom and side walls;

a pedestal supported on the bottom wall;

and wherein the means for moving comprises:

a lead pusher having spaced shoulders extending upwardly therefrom and mounted for reciprocal sliding movement on the pedestal; and a thumb screw, threadedly mounted in one of the side walls of the enclosure and coupled to the lead pusher such that the thumb screw, when rotated in one direction, enables the sliding movement of the shoulders of the lead pusher to engage tip-end portions of the plurality of leads and move the leads into flexed and uncrimped engagement with the respective contacts.

* * * * *